United States Patent
Schroeder

(10) Patent No.: US 7,268,080 B2
(45) Date of Patent: Sep. 11, 2007

(54) METHOD FOR PRINTING CONTACTS ON A SUBSTRATE

(75) Inventor: Uwe Paul Schroeder, Lake Carmel, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/270,400

(22) Filed: Nov. 9, 2005

(65) Prior Publication Data

US 2007/0102397 A1 May 10, 2007

(51) Int. Cl.
*H01L 21/302* (2006.01)
*H01L 21/461* (2006.01)
(52) U.S. Cl. .................. 438/689; 438/711; 438/745
(58) Field of Classification Search .................. 438/689
See application file for complete search history.

(56) References Cited

U.S. PATENT DOCUMENTS

| 5,387,529 | A | 2/1995 | Oku |
| 6,218,251 | B1 * | 4/2001 | Kadosh et al. .............. 438/303 |
| 6,221,777 | B1 | 4/2001 | Singh et al. |
| 6,846,750 | B1 | 1/2005 | Ohiwa et al. |
| 6,853,043 | B2 * | 2/2005 | Yeh et al. .................... 257/437 |
| 2002/0187648 | A1 * | 12/2002 | Wu et al. ..................... 438/745 |
| 2005/0082674 | A1 | 4/2005 | Seta et al. |
| 2005/0186491 | A1 * | 8/2005 | Hsu et al. ...................... 430/30 |
| 2005/0282394 | A1 * | 12/2005 | Chiba .......................... 438/711 |

FOREIGN PATENT DOCUMENTS

| DE | 103 38 503 B3 | 5/2005 |
| EP | 1 286 218 A2 | 2/2003 |
| WO | WO97/40526 A | 10/1997 |

* cited by examiner

*Primary Examiner*—Lan Vinh
*Assistant Examiner*—Mahmoud Dahimene
(74) *Attorney, Agent, or Firm*—Slater & Matsil, L.L.P.

(57) ABSTRACT

A method for printing contacts utilizes photolithographic pattern reversal. A negative of the contact is printed on a resist layer. Unexposed portions of the resist layer are stripped to expose a first layer. The first layer is etched to remove exposed portions of the first layer not covered by the negative of the contact and to expose a second layer. A pattern reversal is performed to cure exposed portions of the second layer not covered by the first layer.

15 Claims, 4 Drawing Sheets

METHOD FOR PRINTING CONTACTS ON A SUBSTRATE

TECHNICAL FIELD

The present invention relates generally to a method for semiconductor fabrication, and more particularly to a method for printing contacts on a substrate.

BACKGROUND

As the feature size of integrated circuits continues to decrease, it becomes more difficult to fabricate certain structures than others. For example, when feature sizes are reduced in size by 70 percent, the two-dimensional dimensions (such as the surface area) of contacts and other structures are actually reduced by 50 percent. Extremely small (ultrasmall) contacts and other structures can be very difficult to create due to difficulties that may arise in creating an appropriate photomask that can be used to print the ultrasmall contacts. When creating ultrasmall contacts, for example, extremely small pinholes need to be created in the photomask, which can lead to imaging difficulties. Furthermore, if the ultrasmall contacts need to be placed close together, their close proximity may cause imaging problems.

A technique that can be used to create the ultrasmall devices involves the use of charged particle and other exotic lithography techniques. These techniques can permit the creation of the desired devices.

One disadvantage of the prior art is that the use of exotic lithography techniques can significantly increase the fabrication costs when compared to standard (and well known) lithography techniques. Since the exotic lithography techniques are not as well tested or developed to help reduce costs, this can increase the overall cost of the integrated circuitry.

Yet another disadvantage of the prior art is that multiple exposures may be needed to print the ultrasmall devices, which can increase the fabrication time and result in reduced production numbers as well as increased costs.

SUMMARY OF THE INVENTION

These and other problems are generally solved or circumvented, and technical advantages are generally achieved, by preferred embodiments of the present invention which provides for a method for printing ultrasmall contacts utilizing photolithographic pattern reversal.

In accordance with a preferred embodiment of the present invention, a method for printing a contact on a semiconductor substrate is provided. A negative of the contact is printed on a resist layer. Unexposed portions of the resist layer are stripped to expose a first layer. The first layer is etched to remove exposed portions of the first layer not covered by the negative of the contact and to expose a second layer. A pattern reversal is performed to cure exposed portions of the second layer not covered by the first layer.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely the printing of ultrasmall contacts using a high transmission attenuated phase shifting photomask. The invention may also be applied, however, to the printing of other small devices and structures in addition to contacts using standard photolithography techniques and standard and/or off-axis illumination (such as annular, quadrupole, and so forth).

Figure 1A:
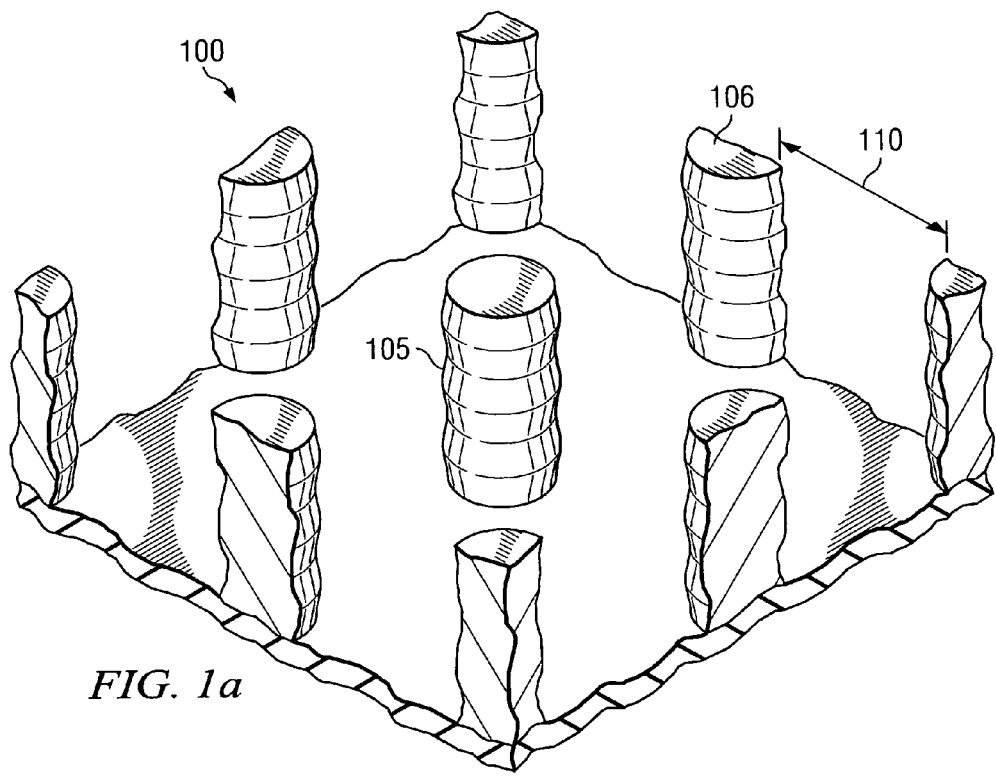
FIGS. 1a and 1b are diagrams of isometric views of ultrasmall contacts.
Figure 1B:
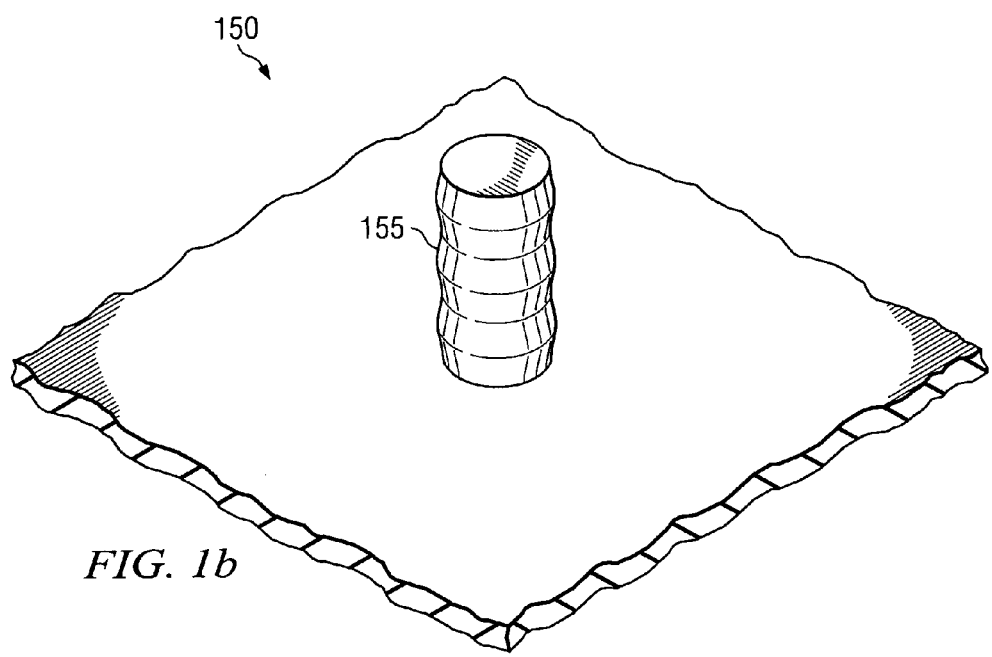

With reference now to FIGS. 1a and 1b, there are shown diagrams illustrating isometric views of contacts formed on a semiconductor substrate. The diagram shown in FIG. 1a illustrates an isometric view 100 of multiple contacts formed on a semiconductor substrate. Contacts, such as contact 105 and contact 106, can have a specified size, for example, 70 nanometers, and when arranged in a regular array, there can also be a pitch, for example 200 nanometers (shown as span 110). The diagram shown in FIG. 1b illustrates an isometric view 150 of a single contact 155.

Using standard photolithography techniques, contacts formed on a semiconductor substrate, such as those shown in FIGS. 1a and 1b, can be printed onto a resist layer using a photomask that is illuminated by a light source. However, if the size of the contacts needs to be small or if multiple contacts need to be printed in close proximity to one another, standard photolithography techniques may not be able to produce desired results. Exotic and expensive photolithography techniques, such as those using chromeless phase shift lithography (CPL) or charged particle direct write technologies may be needed. Additionally, multiple exposures may be required, all of which can lead to an expensive integrated circuit fabrication process.

According to a preferred embodiment of the present invention, ultrasmall contacts (and other ultrasmall structures) can be printed using standard photolithographic techniques without the violation of design rules if pattern reversal is used. For example, when printing ultrasmall contacts becomes too difficult (if not impossible) with standard photolithographic techniques, it may be possible to make use of pattern reversal and print photoresist islands instead of contacts and then convert the photoresist islands into contacts during the fabrication process utilizing pattern reversal.

Figure 2A:
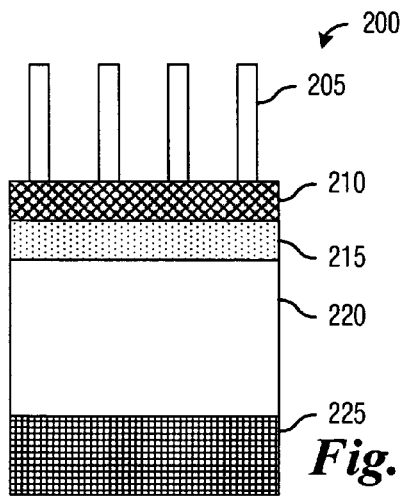
FIGS. 2a and 2b are diagrams of a cross-sectional view of an exemplary integrated circuit, wherein ultrasmall contacts are to be fabricated using a pattern reversal technique and resist islands, and a top view of an exemplary photomask, according to a preferred embodiment of the present invention.
Figure 2B:
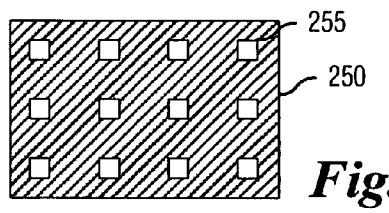

With reference now to FIGS. 2a and 2b, there are shown diagrams illustrating a cross-sectional view of an exemplary integrated circuit, wherein ultrasmall contacts are to be fabricated using a pattern reversal technique and resist islands, and a top view of an exemplary photomask, according to a preferred embodiment of the present invention. The diagram shown in FIG. 2a illustrates the cross-sectional view of an exemplary integrated circuit 200. The integrated circuit 200 includes multiple resist islands, such as resist island 205. The resist island 205 can be formed using standard photolithographic techniques that involve the exposure of a resist layer to light with a desired set of characteristics. The photolithographic resist material may be one of any high contrast chemically amplified 193 nm photoresist, preferably based on copolymers of functionalized methacrylates, acrylates, maleic acid anhydrides, and so forth. The resist layer can then be chemically washed to remove unwanted resist material, leaving the resist islands 205.

With reference now to FIG. 2b, there is shown a top view of an exemplary photomask 250. The photomask 250 may be optically opaque to the light used to expose the resist layer and can have a series of holes, such as hole 255. The hole 255 can permit the light to pass through the photomask 250 and expose the resist layer. According to a preferred embodiment of the present invention, the photomask 250 may be a high transmission attenuated phase shifting mask (HT mask) with at least a 20 percent dark transmission. The photomask 250 may be illuminated with an overexposure of a light with a strong off-axis illumination (such as from annular, quadrupole, and so forth, lights). When so illuminated, dark regions are created at phase edges, resulting in resist islands corresponding to holes in the photomask 250. Surrounding portions of the resist layer are exposed away by the overexposure of the light. This technique yields results similar to when a CPL mask is used, but with an added advantage of being an inexpensive photomask technology.

With reference back now to FIG. 2a, the resist island 205 can be formed on top of an antireflective coating layer (ARC) 210, which in turn, is formed on top of a hard layer mask (HM) 215. Preferably, the ARC 210 can one of any antireflective material based on copolymers of polyphenyls, acrylates, methacrylates, esters, and so on. Hard layer mask materials are preferably chosen from silicon oxide, silicon nitride, polycrystalline silicon, or any other material which can be etched selectively with respect to the underlying ILD. An interlevel dielectric layer (ILD) 220 can separate the ARC 210 and the HM 215 from a substrate 225. Preferably, the ILD 220 can be one of any insulating organic or inorganic material. The ILD 220, the HM 215, and the ARC 210 can be formed on the substrate 225 using one of the many widely used fabrication techniques, and a discussion of the formation of these layers on the substrate 225 will not be provided herein. The relative thicknesses of the layers and structures in the integrated circuit 200 as shown in FIGS. 2a and 2b (as well as other figures) may not be drawn to scale.

Figure 3A:
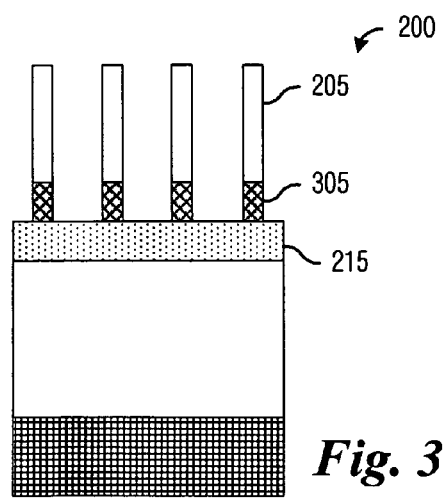
FIGS. 3a and 3b are diagrams of cross-sectional and top views of the exemplary integrated circuit, wherein an ARC etch has been performed, according to a preferred embodiment of the present invention.
Figure 3B:
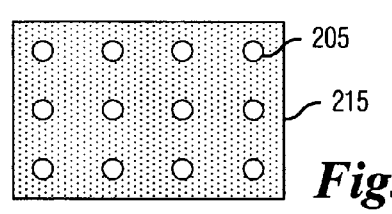

With reference now to FIGS. 3a and 3b, there are shown diagrams illustrating a cross-sectional view and a top view of the exemplary integrated circuit 200, wherein an ARC etch has been performed, according to a preferred embodiment of the present invention. The diagram shown in FIG. 3a illustrates a cross-sectional view of the integrated circuit 200 after the integrated circuit 200 has undergone an open etch to remove exposed portions of the ARC 210. Portions of the ARC 210 (shown as ARC island 305) underneath the resist island 205 are not exposed to the etching material and therefore remain. The removal of the exposed portions of the ARC 210 exposes portions of the HM 215. The diagram shown in FIG. 3b illustrates a top view of the integrated circuit 200 after having undergone the open etch to remove the exposed portions of the ARC 210. The removal of the ARC 210 reveals the underlying HM 215. The ARC island 305 lies directly underneath the resist island 205 and is not visible in the top view.

Figure 4A:
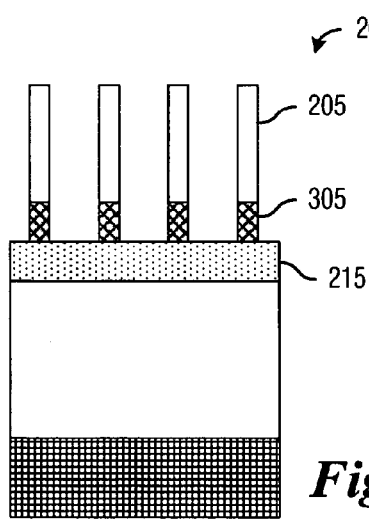
FIGS. 4a and 4b are diagrams of cross-sectional and top views of the exemplary integrated circuit, wherein an optional trim etch has been performed, according to a preferred embodiment of the present invention.
Figure 4B:
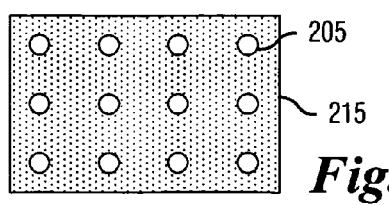

With reference now to FIGS. 4a and 4b, there are shown diagrams illustrating a cross-sectional view and a top view of the exemplary integrated circuit 200, wherein an optional trim etch has been performed, according to a preferred embodiment of the present invention. The diagram shown in FIG. 4a illustrates a cross-sectional view of the integrated circuit 200 after the integrated circuit 200 has undergone a trim etch operation to clean-up the results of the open etch used to remove the exposed portions of the ARC 210, while the diagram shown in FIG. 4b illustrates a top view of the integrated circuit 200. Since the trim etch does not result in substantive changes to the integrated circuit 200, the diagrams shown in FIGS. 4a and 4b look essentially the same as the diagrams shown in FIGS. 3a and 3b.

Figure 5A:
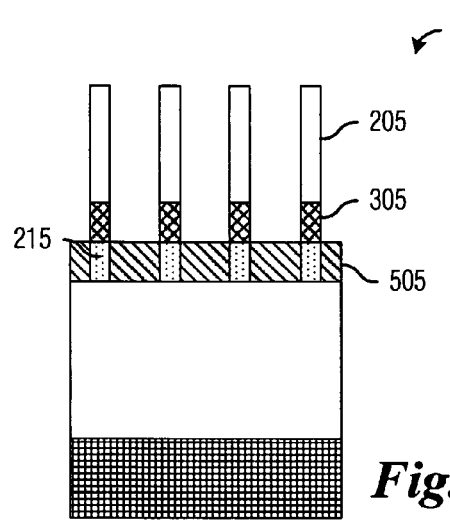
FIGS. 5a and 5b are diagrams of cross-sectional and top views of the exemplary integrated circuit, wherein a pattern reversal step has been performed, according to a preferred embodiment of the present invention.
Figure 5B:
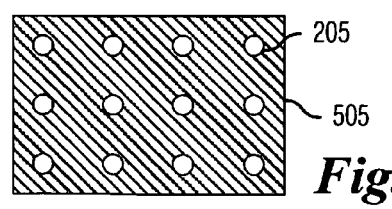

With reference now to FIGS. 5a and 5b, there are shown diagrams illustrating a cross-sectional view and a top view of the exemplary integrated circuit 200, wherein a pattern reversal step has been performed, according to a preferred embodiment of the present invention. After the open etch (and optionally, the trim etch), portions of the HM 215 are now exposed. It is possible to perform a pattern reversal via implanting. In an alternate embodiment, a thin layer of a material (a second deposited layer) different from the hard mask layer can be deposited after the hard mask layer has been etched open and the photoresist has been stripped. Then, using chemical mechanical polishing (CMP), both layers can be polished down to a common level. This can be followed by using a selective etch which attacks only the hard mask layer and does not affect the second deposited layer. The selective etch can then achieve a pattern reversal. The implanting physically and chemically changes exposed portions of the HM 215 (portions not covered by the resist island 205) and is shown in FIG. 5a as material 505. The diagram shown in FIG. 5b illustrates a top view of the integrated circuit 200, with the exposed portions of the HM 215 (now converted due to the implantation and shown as material 505) and the resist islands 205 visible.

Figure 6A:
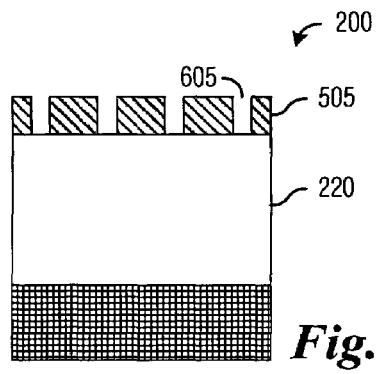
FIGS. 6a and 6b are diagrams of cross-sectional and top views of the exemplary integrated circuit, wherein a resist strip and selective etch have been performed, according to a preferred embodiment of the present invention.
Figure 6B:
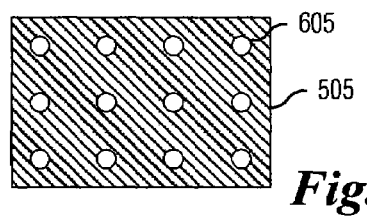

With reference now to FIGS. 6a and 6b, there are shown diagrams illustrating a cross-sectional view and a top view of the exemplary integrated circuit 200, wherein a resist strip and selective etch have been performed, according to a preferred embodiment of the present invention. After the pattern reversal (the results of which are shown in FIGS. 5a and 5b), a resist strip (to remove the resist islands 205) and a selective etch (to remove the unexposed HM 215) can be performed. The selective etch may be a wet etch process that is targeted to remove only any remaining HM 215 (the selective etch removes the unexposed portions of HM 215, not the portions of HM 215 converted via the pattern reversal as shown in FIGS. 5a and 5b). The removal of the unexposed portions of HM 215 results in a series of openings, such as opening 605, in the integrated circuit 200. The opening 605 exposes parts of the ILD 220. The diagram shown in FIG. 6a illustrates a cross-sectional view of the integrated circuit 200 and the diagram shown in FIG. 6b illustrates a top view of the integrated circuit 200, clearly showing the openings 605 in the integrated circuit 200.

Figure 7A:
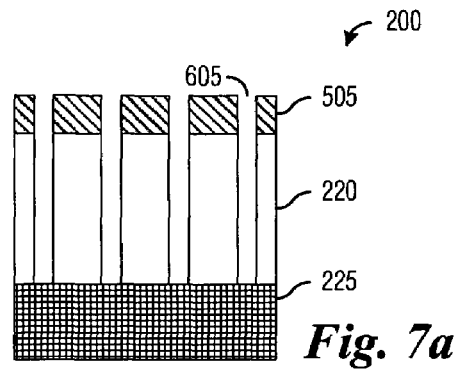
FIGS. 7a and 7b are diagrams of cross-sectional and top views of the exemplary integrated circuit, wherein a dry etch of the ILD 220 has been performed, according to a preferred embodiment of the present invention.
Figure 7B:
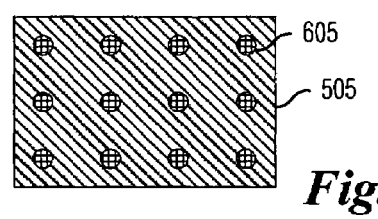

With reference now to FIGS. 7a and 7b, there are shown diagrams illustrating a cross-sectional view and a top view of the exemplary integrated circuit 200, wherein a dry etch of the ILD 220 has been performed, according to a preferred embodiment of the present invention. With the unexposed portions of the HM 215 removed, a dry etch can be used to remove portions of the ILD 220 that are now exposed by the removal of the unexposed portions of the HM 215. The diagram shown in FIG. 7a illustrates a cross-sectional view of the integrated circuit 200, wherein the opening 605, which prior to the dry etch of the ILD 220 stopped at the ILD 220, now extends all the way through the ILD 220 to the substrate 205. The opening 605 was formerly resist island 205 is not a hole through the ILD 220 and will become a contact. The diagram shown in FIG. 7b illustrates a top view of the integrated circuit 200, with the opening 605 showing the material of the substrate 225.

Figure 8A:
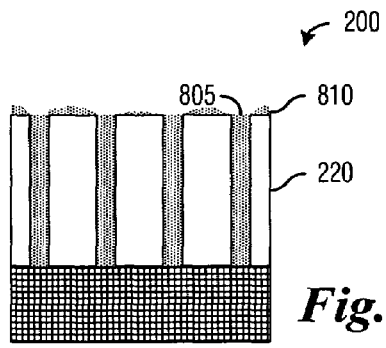
FIGS. 8a and 8b are diagrams of cross-sectional and top views of the exemplary integrated circuit, wherein an HM strip, liner deposition, and tungsten deposition has been performed, according to a preferred embodiment of the present invention.
Figure 8B:
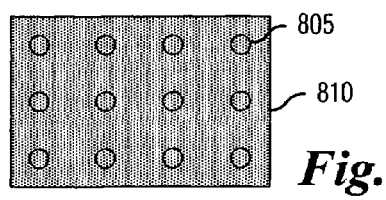

With reference now to FIGS. 8a and 8b, there are shown diagrams illustrating a cross-sectional view and a top view of the exemplary integrated circuit 200, wherein an HM strip, liner deposition, and tungsten deposition has been performed, according to a preferred embodiment of the present invention. Once the opening 605 has been extended to the substrate 225, any remaining exposed portion of HM 215 (FIGS. 7a and 7b) can be removed with a stripping operation, such as with an HM strip. With the exposed portions of the HM 215 removed, the contacts can be created. A liner deposition and a tungsten (or some other conductive material) deposition can be performed to create contacts 805. The tungsten deposition can be achieved using physical vapor deposition (PVD), for example. The contacts 805 fill the opening 605 with some overflow material 810.

The diagrams shown in FIGS. 8a and 8b illustrate cross-sectional and top views of the integrated circuit 200. As an alternative to tungsten, other conductive materials like highly doped polycrystalline silicon or copper can be used.

Figure 9A:
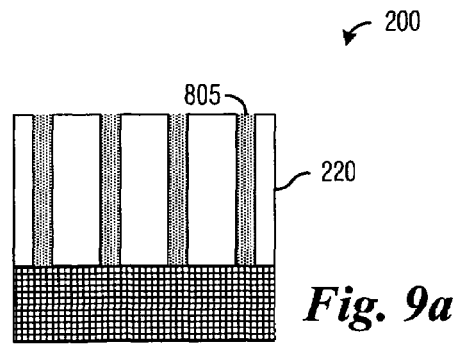
FIGS. 9a and 9b are diagrams of cross-sectional and top views of the exemplary integrated circuit, wherein a chemical-mechanical polish has been performed, according to a preferred embodiment of the present invention.
Figure 9B:
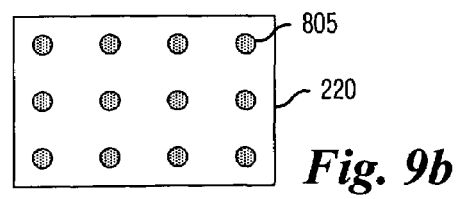

With reference now to FIGS. 9a and 9b, there are shown diagrams illustrating a cross-sectional view and a top view of the exemplary integrated circuit 200, wherein a chemical-mechanical polish has been performed, according to a preferred embodiment of the present invention. The overflow material 810 can cause electrical short circuits, and therefore needs to be removed prior to the completion of the integrated circuit 200. Furthermore, there may be a desire to planarize the surface of the integrated circuit 200 to prepare for any additional fabrication. A chemical mechanical polishing, or chemical mechanical planarization (CMP), step can be applied to the integrated circuit 200 to remove overflow material 810 as well as planarize the surface of the integrated circuit 200.

Figure 10:
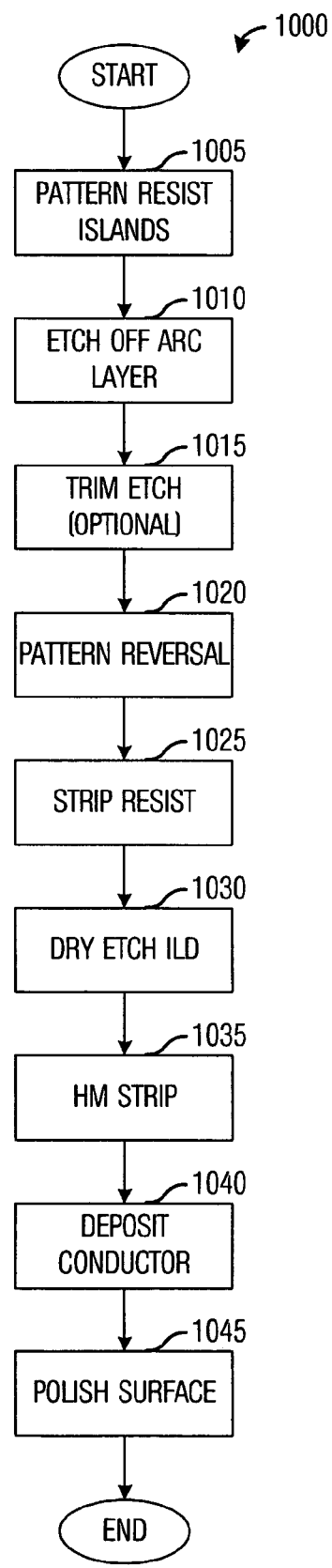
FIG. 10 is a diagram of a sequence of events in the fabrication of an integrated circuit with ultrasmall contacts, according to a preferred embodiment of the present invention.

With reference now to FIG. 10, there is shown a diagram illustrating a sequence of events 1000 in the fabrication of an integrated circuit with ultrasmall contacts, according to a preferred embodiment of the present invention. The sequence of events 1000 illustrates the fabrication of ultrasmall contacts using a preferred embodiment of the present invention and does not illustrate any processing that may be performed to a semiconductor substrate prior to the fabrication of the ultrasmall contacts or after the fabrication of the ultrasmall contacts. For example, a semiconductor substrate may undergo a number of fabrication events prior to the beginning of the fabrication of the ultrasmall contacts, such as formation of an ILD, deposition of an HM layer, an ARC, and a resist layer, and so on.

The fabrication of the ultrasmall contacts can begin with a patterning of resist islands on the resist layer (block 1005). The resist islands may be an optical negative of the ultrasmall contacts that are to be fabricated. The resist islands can be patterned using a high transmission attenuated phase shifting mask (HT mask) with at least a 20 percent dark transmission that is illuminated with an overexposure of a light with a strong off-axis illumination. An example of such an HT mask is shown in FIG. 2b. After patterning the resist layer, a resist strip can be applied to remove unexposed portions of the resist layer, leaving the resist islands. An ARC etch can then be used to etch off portions of the ARC that are not underneath the resist islands (block 1010). This will expose portions of an HM layer, with portions of the HM layer remaining covered by the resist islands. An optional trim etch (block 1015) can be used to clean up the results of the ARC etch (block 1010). The trim etch would preferably contain oxygen in the plasma to etch the organic photoresist structures laterally away, thus shrinking the size of the resist islands.

This can then be followed by a pattern reversal (block 1020), which will cure exposed portions of the HM layer and make the exposed portions of the HM layer resistant to a resist and HM strip operation. As an example, the pattern reversal can be achieved via implant. A resist strip operation (block 1025) removes the resist island. After that, the unexposed portions of the HM layer beneath the resist islands can be etched selectively utilizing a wet etch. This operation (block 1025) will expose portions of the ILD, which can be removed with a dry etch (block 1030). The dry etch of the ILD can remove exposed portions of the ILD down to the semiconductor substrate. An HM strip can remove any remaining HM layer material (block 1035), cured or uncured. Contact liner deposition along with a physical vapor deposition of a conductive material (such as tungsten) can then be used to actually form the contacts (block 1040). A polish (or planarization) can then be used to remove any excess liner material or conductive material (block 1045).

Various embodiments of the present invention include a number of advantages. For example, one advantage of embodiments of the present invention is that standard lithographic technology is used, so the fabrication process is well understood, debugged, and relatively inexpensive. This can lead to increased product yield and overall reduced cost.

A further advantage of preferred embodiments of the present invention is that the printing times are shorter than prior art techniques for printing ultrasmall contacts. Therefore, more integrated circuits can be produced within a given period of time.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for printing a contact on a semiconductor substrate, the method comprising:
    printing a negative of the contact on a resist layer, wherein the printing comprises illuminating a high transmission attenuated phase shifting mask (HT mask);
    stripping unexposed portions of the resist layer to expose an antireflective coating layer;
    etching the antireflective coating layer to remove exposed portions of the antireflective coating layer not covered by the negative of the contact and to expose a hard mask layer;
    trim etching said antireflective coating layer;
    performing a pattern reversal to cure exposed portions of the hard mask layer not covered by the antireflective coating layer;
    stripping the negative of the contact on said resist layer and uncovered portions of the hard mask layer to expose an ILD (interlevel dielectric) layer; and
    dry etching the exposed portion of the ILD layer to expose a top surface of a semiconductor substrate.

2. The method of claim 1, wherein the HT mask has at least a 20 percent transmission.

3. The method of claim 1, wherein a light source illuminating the HT mask has a strong off-axis illumination.

4. The method of claim 3, wherein the light provides an overexposure of light.

5. The method of claim 1, wherein the etching of the antireflective coating is achieved using an open etch.

6. The method of claim 1, wherein the hard layer mask is formed from a material selected from the group comprising: silicon oxide, silicon nitride, and polycrystalline silicon.

7. A method for fabricating an integrated circuit using standard lithography techniques, the method comprising:
    printing a negative of a structure on a resist layer;
    stripping unexposed portions of the resist layer to expose a first layer,
    etching the first layer to remove exposed portions of the first layer not covered by the negative of the structure and to expose a second layer;
    trim etching the first layer covered by the resist layer;
    performing a pattern reversal to cure exposed portions of the second layer not covered by the first layer;
    stripping away the negative of the structure on said resist layer and the uncured portions of the second layer under the photoresist layer to expose an ILD (interlevel dielectric) layer;
    dry etching the exposed portion of the ILD layer to expose a top surface of a semiconductor substrate;
    stripping away the cured portion second layer; and
    depositing a material to form the structure.

8. The method of claim 7, further comprising, after the depositing step, planarizing a top surface of the integrated circuit.

9. The method of claim 7 further comprising after the second stripping step, depositing a liner material on the third layer.

10. The method of claim 7, wherein the structure comprises an contact, and the contact is formed by depositing at least one material selected from the group consisting of tungsten, highly doped polycrystalline silicon, and copper.

11. The method of claim 7, wherein the negative is an optical negative.

12. The method of claim 7, wherein the printing comprises illuminating a high transmission attenuated phase shifting mask (HT mask).

13. The method of claim 7 wherein the trim etching comprises the use of oxygen in a plasma to laterally etch the resist material and the first layer, further shrinking the negative of the contact.

14. The method of claim 7, wherein the pattern reversal is achieved via an implantation of nitrogen.

15. The method of claim 7, wherein the printing of the negative comprises printing negatives of a plurality of contacts.

* * * * *